United States Patent [19]
King et al.

[11] 3,981,023
[45] Sept. 14, 1976

[54] INTEGRAL LENS LIGHT EMITTING DIODE

[75] Inventors: Frederick David King, Smith Falls; Anthony John Springthorpe, Richmond, both of Canada

[73] Assignee: Northern Electric Company Limited, Montreal, Canada

[22] Filed: Sept. 16, 1974

[21] Appl. No.: 506,095

[52] U.S. Cl. ................................. 357/17; 357/16; 357/19; 148/175
[51] Int. Cl.² ................................ H01L 33/00
[58] Field of Search .................... 357/16, 19, 17; 148/175

[56] References Cited
UNITED STATES PATENTS 3,758,875  9/1973  Hayashi .......................... 331/94.5
3,852,798  12/1974  Leabailly ........................ 357/19

OTHER PUBLICATIONS

Potemski et al., *IBM Tech. Discl. Bull.*, vol. 15, No. 1, June 1972.

*Primary Examiner*—Martin H. Edlow
*Attorney, Agent, or Firm*—Sidney T. Jelly

[57] ABSTRACT

A light emitting diode structure has one or more convex lens formations formed on the surface through which the light issues to provide larger incident angles and reduce internal reflection. Conveniently the structure comprises a multi-layer epitaxially grown structure, and the lens or lenses may be formed integral with the outer surface.

6 Claims, 12 Drawing Figures

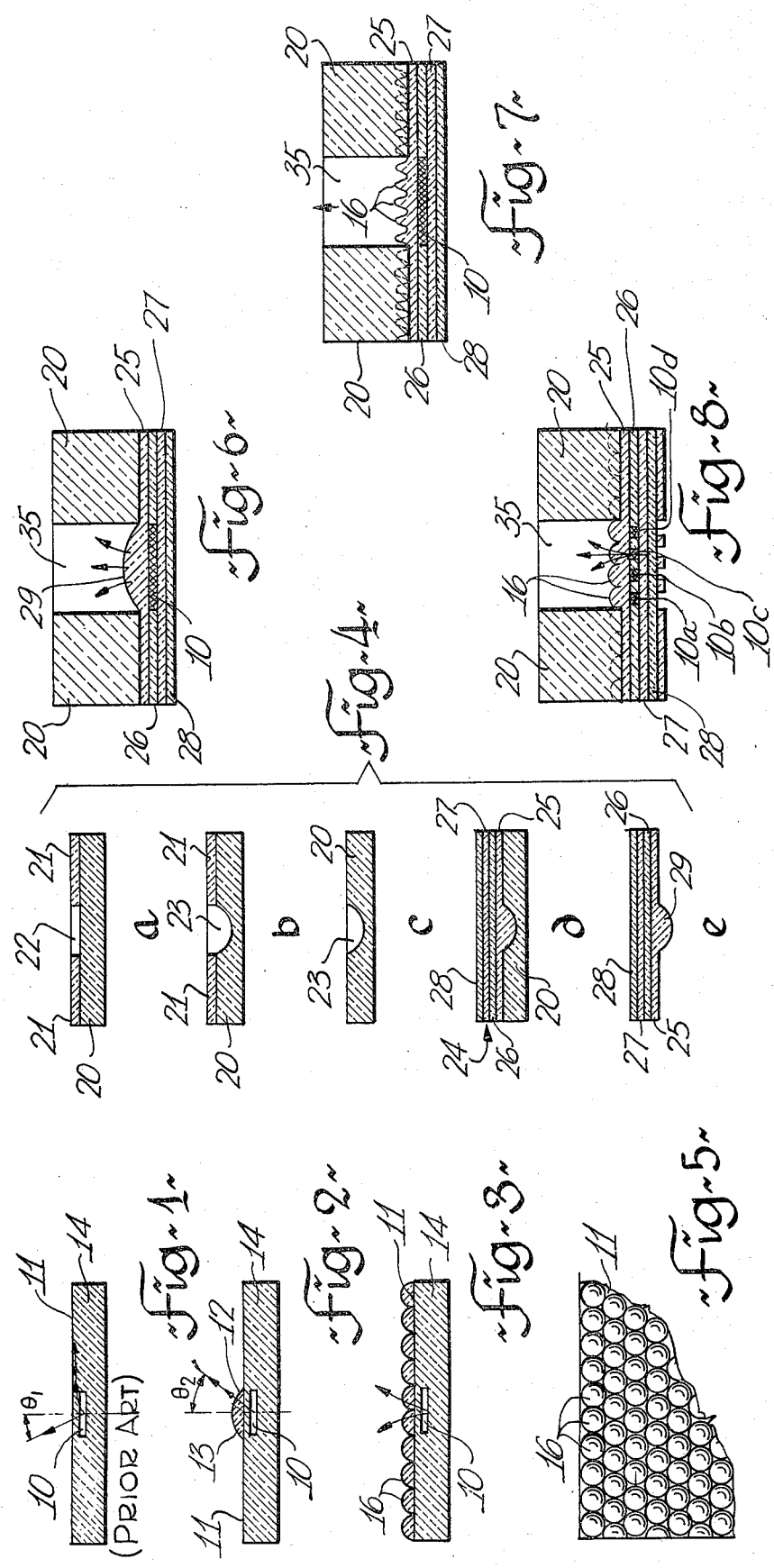

INTEGRAL LENS LIGHT EMITTING DIODE

This invention relates to integral lens light emitting diodes and in particular to such diodes for coupling to optical fibers.

Internal efficiencies, that is the ratio of minority carriers injected to the photons generated, are known to be as high as 50% in GaAs p-n junctions. However, the index change between GaAs ($n = 3.6$) and any practical surrounding or coupling medium is large - typically $n = 1.5$ for such mediums. Thus the incident angle for light to be emitted from the diode is small. Most of the photons generated by carrier recombination are internally reflected many times and are eventually absorbed within the device. Net efficiencies — to air — in parallel faced light emitting diodes (hereinafter referred to as LEDs) seldom exceed 5%. Coupling efficiencies to fibers having finite acceptance angles are further reduced.

With low coupling efficiencies, LEDs must be operated at high current densities to obtain sufficient light in the fiber for optical communication. High current densities result in heating and in degradation of the device.

The present invention modifies the face of the LED through which the light is emitted to permit light having larger incident angles to emit from the LED. LEDs in accordance with the present invention have the surface through which light emits with one or more lens shapes, the lenses being convex.

The invention will be readily understood by the following description of certain embodiments of the invention and methods of producing such embodiments in conjunction with the accompanying diagrammatic drawings, in which:

FIG. 1 is a cross-section through a conventional LED;

FIGS. 2 and 3 are cross-sections similar to FIG. 1 illustrating two alternative forms of lens formation in accordance with the present invention;

FIGS. 4a to 4e are cross-sections illustrating one method of forming an LED structure as in FIG. 2;

FIG. 5 is a plan view of an LED having a lens formation of the form as in FIG. 3;

FIGS. 6, 7 and 8 are cross-sections illustrating further forms of LED structure.

As seen in FIG. 1, light emitted from the source 10 will only emit through the surface 11 if the angle of incidence $\theta$ of the light rays at the surface 11 is less than approximately 17°. Any light rays having an angle of incidence $\theta$ greater than 17° will not issue through the surface 11 but will be internally reflected. FIG. 2 illustrates a structure having a single convex lens formation 12 on the light emission surface 11, in accordance with the present invention. Such an arrangement gives a larger angle of incidence $\theta_2$, $\theta_2$ being considerably larger than $\theta_1$. The value of $\theta_2$ will depend upon the radius of curvature of the surface 13 of the lens formation 12. The material forming the lens formation 12 is the same as the basic substrate 14.

FIG. 3 illustrates an alternative form of lens formation in accordance with the present invention. Formed on the surface 11 is a plurality of convex lens formations 16. Again the material of the lens formations 16 is the same as the substrate 14, or of a material having the same refractive index as the substrate 14, the same criterion applying to the lens formation 12 of FIG. 2.

The arrangement of FIG. 3 gives increased values for $\theta$ and makes maximum use of the light emitted from the source.

FIG. 4 illustrates the steps for forming a single lens formation as in FIG. 2. A substrate 20 has a photoresist mask 21 formed thereon with a hole 22 positioned where a lens formation is required — FIG. 4a. The substrate in the present example is GaAs. The GaAs substrate 20 is etched through the mask 21 to form a concave depression 23 — FIG. 4b. The mask 21 is stripped to leave the depression 23 — FIG. 4c. A standard double heterostructure 24 is grown on the substrate, comprising four layers 25, 26, 27 and 28. The layer 25 fills the depression 23 — FIG. 4d. Finally the substrate 20 is etched away using a preferential etch process to leave a double heterostructure with a convex lens formation 29. The confined active layer of the structure is layer 26.

Where a plurality of lens formations are formed on the surface 11 of the structure, as in FIG. 3, the mask can have a large number of holes formed thereon in a definite pattern or in a random pattern. FIG. 5 illustrates a plan view of the surface of a device or structure having a plurality of randomly aligned lens formations 16. Typically, assuming a fiber diameter of approximately 150$\mu$, the lens formations would have a diameter at their largest dimension, of approximately 30$\mu$ and a depth of approximately 10$\mu$.

An example of a process for the manufacture of an LED having a lens formation is as follows: On a polished GaAs substrate is deposited a layer, approximately 2000Å thick, of $SiO_2$. This layer is a masking layer. A layer of photoresist is applied to the $SiO_2$ layer and a pattern of 5$\mu$ diameter holes on 10$\mu$ centres is developed. The rows are staggered, or offset, by 20$\mu$. The oxide layer is etched through the holes in photoresist layer in buffered hydrofluoric acid for approximately 30 seconds. The photoresist is stripped and then holes or depressions approximately 15$\mu$ deep are etched in the substrate through the etched holes in the $SiO_2$ mask, using non-preferential etch, for example $3H_2SO_4/1H_2O_2$ for 2 minutes at 98°C. The remainder of the $SiO_2$ mask layer is then etched off, using concentrated hydrofluoric acid, for about 1 minute.

The use of the $SiO_2$ masking layer is not essential as the photoresist layer could be used directly on the mask. The use of an oxide mask allows for a cleaner process.

Following production of the etched holes in the substrate, equivalent to the situation in FIG. 4c, the LED crystal growth is carried out. The crystal growth is by liquid phase epitaxial (LPE) growth and any well known method can be used. In the present example four layers are sequentially grown. Details of the layers are as follows, layer 1 being deposited in the depressions and over the substrate surface.

Layer 25 is grown from a melt solution containing 4gm Ga : 250mg GaAs : 6mg Al : 2mg Te : 100mg GaP. The solution in contact with the substrate is cooled through the temperature range of 830°C – 820°C to give an LPE layer of approximately 5$\mu$m, having an approximate composition of $Ga_{0.65}Al_{0.35}As_{0.98}P_{0.01}$ with a doping level of approximately $10^{18}$.

Layer 26 is grown from a melt solution containing 4gm Ga : 350mg GaAs : 0.8mg Al : 24mg Si. The solution in contact with layer 25 on the substrate is cooled through the range 820°C – 819°C to give an LPE layer of approximately 1$\mu$m, having an approximate composition of $Ga_{0.97}Al_{0.03}$ As with a doping level of approximately $10^{18}$.

Layer 27 is LPE grown on layer 26 from a melt solution containing 4gm Ga : 250mg GaAs : 7mg Al : 150mg Gap. This solution is cooled through the temperature range of 819°C to 817°C to give a layer approximately 1μm thick, having a composition approximately $G_{0.65}Al_{0.35}As_{0.48}P_{0.02}$, and a doping level of approximately $10^{18}$.

Finally layer 28 is LPE grown on layer 27 from a melt solution containing 4gm Ga : 350m GaAs : 60mg Ge, cooled through a temperature range of 817°C – 816°C to give a layer approximately 1μm thick, having a composition of GaAs with a doping level of approximately $10^{18}$.

The epitaxially grown layers can be grown sequentially by positioning substrate wafers in a carbon slider which moves along to position the substrate wafers sequentially under reservoirs in a carbon holder. The solutions are formulated, as described above, to give the required layer characteristics. A typical form of apparatus for growing three layers is described in the paper "Preparation of GaAs p-n Junctions" by B. I. Miller and H. C. Casey, Jr., paper 24 in the 1972 Symposium of GaAs. The apparatus described can also produce four layers. A further form of apparatus for growing multiple layers is described in Canadian Pat. No. 902,803 issued June 13th, 1972. Alternatively, the layers can be grown one at a time, using well known liquid phase epitaxy techniques.

By providing an arcuate surface, or a multiplicity of arcuate surfaces, over the light emittion region or source 10, the loss of emission due to internal reflection at the emission surface is considerably reduced.

The invention is also applicable to the well known "Burrus" type of light emitting diode. FIGS. 6, 7 and 8 illustrate further forms of such a device. After formation of a single or multiple "lens" structure as described above, the substrate 20 is etched to form the opening 35.

In FIGS. 6 and 7 the emitting area 10 extends for the full width of the opening 35. In FIG. 8 the current is further confined to a number of smaller ($\simeq 10\mu$ diameter) emitting areas 10a, 10b, 10c and 10d. Each area is located under the center of a related lens. In this way a further increase in coupling efficiency can be obtained. The additional confinement may be obtained by using a suitable photoresist mask in step (b) below.

Several well known ways exist for achieving current confinement on the p-side of the junction to define areas 10. A typical method is as follows:

a. Deposit 1500A $SiO_2$ on p-side of crystal by C.V.D.
b. Photoresist pattern of 125 holes on 20 mil. centres.
c. Etch holes in $SiO_2$ (buffered HF)
d. Strip photoresist.
e. Skin diffuse sample (typically 15 mins. 600°C in semisealed capsule with $ZnAs_2$ diffusion source).
f. Lap ($Al_2O_3$) N-side to thickness of ~5 mils.
g. Etch further ~1 mil off N-side.
h. Evaporate ~200A Au/Ge alloy followed by 3 KA on N-surface.
i. Alloy (~650°C 1 min.)
j. Photoresist pattern of 125μ holes on 20 mil. centres onto N-side layer (aligned with holes in P-side oxide).
k. Etch holes in layer KI ~ 1 min.).
l. Strip photoresist.
m. Evaporate ~2 KA Ge/Au on P-side.
n. Mount P-side down in black wax.
o. Etch away substrate through N-side contact holes ~15 mins. 30 $H_2O_2$/1 $NH_4OH$ ultrasonic until lens pattern is exposed.
p. Remove from wax.

What is claimed is:

1. An integral lens light emitting diode structure, said light emitting diode comprising a substrate of semiconductor material of one conductivity type and sequential layers of semiconductor material on one surface of said substrate, said layers comprising a first confining layer on said substrate, an active layer on said first confining layer and a second confining layer on said active layer, said first confining layer of the same conductivity type as said substrate, said second confining layer of the opposite conductivity type to said first confining layer, and said active layer of either conductivity type to produce a p-n junction between said active layer and one of said confining layers;

contact means on said substrate and said second confining layer to define a light emitting region in said active layer;

an aperture through said substrate to said first confining layer, in alignment with said light emitting region; and a lens structure on said first confining layer, said lens structure extending into said aperture, integral with and forming part of said first confining layer.

2. A light emitting diode as claimed in claim 1, said lens formation comprising a plurality of convex lenses.

3. A light emitting diode as claimed in claim 2, including a single light emitting source common to all said lenses.

4. A light emitting diode as claimed in claim 2, including a plurality of light emitting sources, a source related to each lens.

5. An integral lens light emitting diode comprising:
a substrate of GaAs semiconductor material of one conductivity type;
a first confining layer of highly doped GaAs semiconductor material on said substrate, said first confining layer of the same conductivity type as said substrate;
an active layer of doped GaAs semiconductor material on said first confining layer, said active layer of either conductivity type;
a second confining layer of doped GaAs semiconductor material on said active layer, said second confining layer of the opposite conductivity type to that of said substrate;
contact means on said second confining layer and said substrate to produce a light emitting region in said active layer;
an aperture through said substrate in alignment with said light emitting region;
a lens structure on said first confining layer extending into said aperture, said lens structure integral with and forming part of said first confining layer.

6. A method of producing an integral lens light emitting diode, comprising:
masking a surface of a GaAs substrate of one conductivity type to define at least one lens position;
etching at least one concave depression in said substrate at said lens position;
sequentially growing on said substrate by liquid phase epitaxy a first confining layer of GaAs, an active layer of GaAs and a second confining layer of GaAs, said first confining layer extending into and filling said concave depression to form an integral lens structure, said first confining layer of the same conductivity type as said substrate, said second confining layer of opposite conductivity type as said substrate and said active layer of either conductivity type;

etching through said substrate to said first confining layer to form an aperture aligned with said lens structure;

forming contact means to produce a light emitting region aligned with said lens structure.

* * * * *